United States Patent [19]

Quon et al.

[11] Patent Number: 5,448,108
[45] Date of Patent: Sep. 5, 1995

[54] COOLING OF SEMICONDUCTOR POWER MODULES BY FLUSHING WITH DIELECTRIC LIQUID

[75] Inventors: William Quon, Alhambra; Herbert J. Tanzer, Topanga, both of Calif.

[73] Assignee: Hughes Aircraft Company, Los Angeles, Calif.

[21] Appl. No.: 146,686

[22] Filed: Nov. 2, 1993

[51] Int. Cl.⁶ .................... H01L 25/04; H01L 23/02
[52] U.S. Cl. .................... 257/714; 257/715; 361/699; 361/719; 361/720
[58] Field of Search ........... 257/714, 715; 361/689, 361/699, 717, 718, 719, 720

[56] References Cited

U.S. PATENT DOCUMENTS

| | | |
|---|---|---|
| 4,694,323 | 9/1987 | Itahana et al. .......... 257/715 |
| 4,757,370 | 7/1988 | Agonafer et al. ........ 257/715 |
| 4,847,731 | 7/1989 | Smolley ................. 257/715 |
| 4,949,164 | 8/1990 | Ohashi et al. .......... 257/715 |
| 5,262,921 | 11/1993 | Lamers ................. 257/714 |
| 5,270,572 | 12/1993 | Nakajima et al. ....... 257/714 |

FOREIGN PATENT DOCUMENTS

| | | | |
|---|---|---|---|
| 0367630 | 5/1990 | European Pat. Off. ...... | 257/714 |
| 0147656 | 5/1992 | Japan ................... | 257/714 |
| 0147657 | 5/1992 | Japan ................... | 257/714 |
| 0256348 | 9/1992 | Japan ................... | 257/714 |
| 0256349 | 9/1992 | Japan ................... | 257/714 |

*Primary Examiner*—Robert P. Limanek
*Assistant Examiner*—David Ostrowski
*Attorney, Agent, or Firm*—Leonard A. Alkov; W. K. Denson-Low

[57] ABSTRACT

Semiconductor dies (30–40) are mounted on a printed wiring board (28) to be vertically oriented. They are enclosed in a housing (12) which is supplied with an upwardly flowing dielectric liquid coolant. Nozzles (18,20) direct the dielectric liquid coolant to flow upward over the dies and printed wiring board. Heat is directly extracted from the dies.

1 Claim, 1 Drawing Sheet

COOLING OF SEMICONDUCTOR POWER MODULES BY FLUSHING WITH DIELECTRIC LIQUID

FIELD OF THE INVENTION

This invention is directed to the structure of an electronic power module which has its dies mounted so as to extract heat therefrom by flushing them with dielectric liquid which absorbs heat to reduce the temperature of the power module dies.

BACKGROUND OF THE INVENTION

Semiconductor electronic devices have internal losses which generate heat. When the electronic device is configured for a substantial amount of power, cooling is necessary in order to limit the semiconductor device to a sufficiently low temperature to provide a reasonable life.

It is conventional to remove heat from the dies of an electronic power module by hermetically enclosing the dies in a housing and then cooling the housing. Power modules containing this type of semiconductor component are traditionally attached to a cold plate. The cold plate may have fins thereon with circulation of fluid therepast. The fluid is usually liquid when greater amounts of heat must be dissipated. The heat has to travel from the die through the many layers of material before arriving at the cold plate or the housing case. The resistance to heat flow through each of the materials and interfaces causes the die to operate at a higher temperature or at a lower current level. It can be seen that, by reducing the material layers and interfaces between the coolant fluid and the heat-producing die, heat can be more readily extracted so that a die can carry higher current at the same junction temperature.

SUMMARY OF THE INVENTION

In order to aid in the understanding of this invention, it can be stated in essentially summary form that it is directed to an electronic power module which has a dielectric coolant liquid flowing in direct contact with the semiconductor power devices to reduce the number of layers and interfaces between the die and the flowing dielectric coolant liquid.

It is thus a purpose and advantage of this invention to provide a power module which is in direct contact with a flowing dielectric coolant fluid to limit the temperature of the semiconductor device.

It is another purpose and advantage of this invention to provide a dielectric liquid coolant which is flowing in direct contact with the semiconductor devices and which has an adequate coefficient of thermal conduction via extended area thermal conduction paths such as pins or leads so that the pins or leads act as heat paths for conducting heat away from semiconductor devices into the flowing dielectric liquid coolant.

It is another purpose and advantage of this invention to position the die and its substrate in a vertical orientation and position coolant flow holes which direct flowing dielectric coolant in a generally vertical direction and direct the flow over the dies and substrate.

Other purposes and advantages of this invention will become apparent from a study of the following portion of the specification, the claims and the attached drawings wherein:

DESCRIPTION OF THE PREFERRED EMBODIMENT

Figure 1:
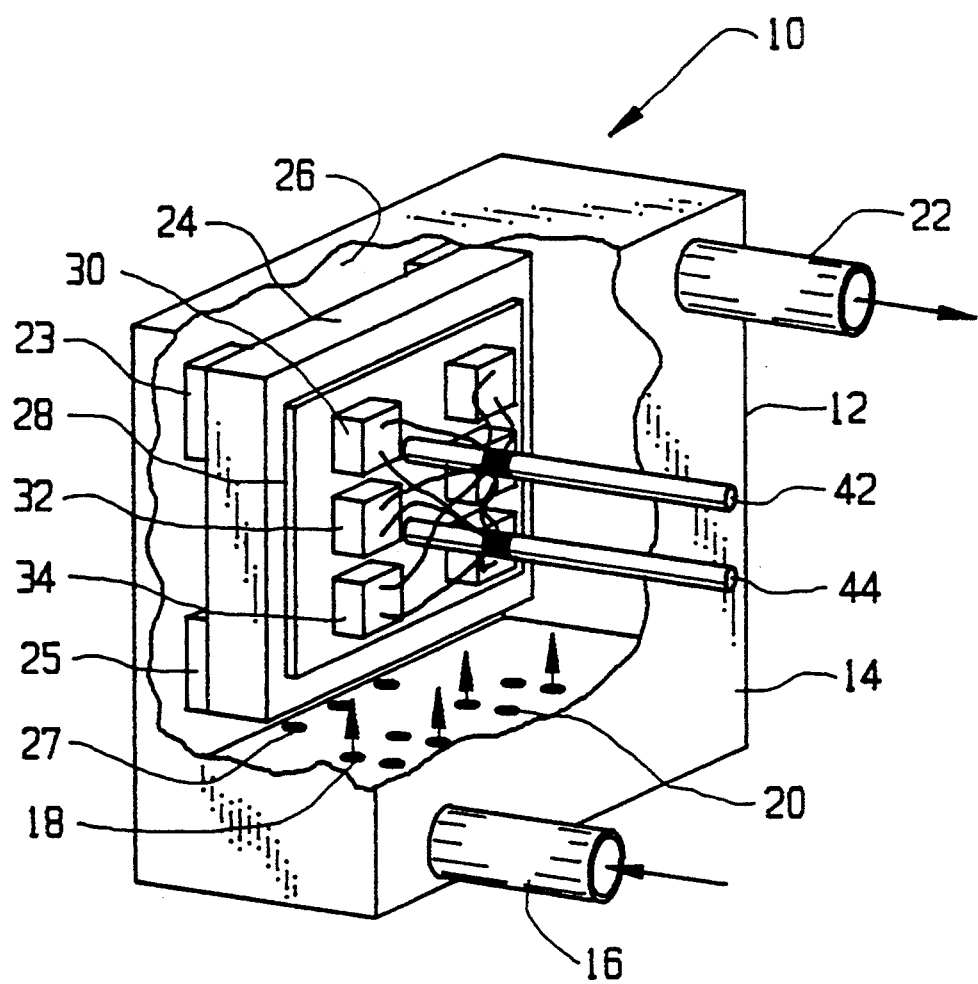
FIG. 1 is an isometric view of a power module in its housing, with part of the housing broken away showing several dies mounted on a board therein and showing dielectric liquid flow holes directed thereto.

A power module having flowing dielectric liquid cooling and configured in accordance with this invention is generally indicated at 10 in FIG. 1. Power module 10 is contained in a housing through which the flowing dielectric liquid coolant passes. Housing 12 is sealed other than the liquid flow ports. Plenum 14 forms the bottom of the housing 12. Plenum 14 has a liquid dielectric coolant connection 16 through which flowing dielectric liquid is introduced into the plenum. Nozzle holes in groups 18 and 20 are dielectric liquid coolant openings in the bottom to deliver the dielectric liquid across the dies. Outlet connection 22 near the top of the housing permits the dielectric liquid to pass from the housing.

Base plate 24 is mounted in housing 12 and is mounted on standoffs 23 and 25 to hold it away from the back wall 26 of the housing. Nozzle holes 27 deliver coolant flow behind the baseplate. The base plate 24 is a structural member which supports printed wiring board 28 which may carry printed wiring for the power and control of the dies mounted thereon.

Dies 30, 32 and 34 are mounted on the front of printed wiring board 28. The dies 30, 32 and 34 are mounted in an upright row above the nozzle group 18 so that dielectric liquid will be directed from these nozzle holes directly across this group of dies. Similarly, dies 36, 38 and 40 are mounted on the printed wiring board 28 in an upright row. The nozzle group 20 directs dielectric liquid directly across these dies. The individual junctions on the dies are connected in the suitable parallel/series connections in order to provide the desired current and voltage capabilities. The dies are wired to conductors 42 and 44, which are for suitable electrical connection. As is seen, each of the dies is connected to each of the conductors. These exposed die connection wires also increase the area exposed to the flowing dielectric liquid. Stub wires from the die also improve heat transfer.

The dies and the printed wiring board are oriented in a vertical direction. The nozzle hole groups are directed to increase the velocity of the flowing dielectric liquid across the dies for improved heat transfer directly between the dies and the fluid. This reduces the temperature rise of the dies and permits higher performance. The direct heat transfer from the dies to the dielectric liquid coolant maintains the lower temperature at the dies at the same power rating, as compared to using a cold plate and extracting heat therefrom. The removal of heat directly from the dies helps reduce device operating temperature. Furthermore, the structure need not be designed for extraction of heat through the printed wiring board in the base, which requires special high thermal capacity mounting. Thus, there is a potential reduction in weight and volume. This improved method of heat removal either increases the unit output by allowing higher output per device, improves unit reliability by having lower junction temperatures, or reduces cooling system requirements by allowing higher inlet temperatures or lower flow rates for the coolant.

The housing 12 is dielectric or it has dielectric feed-throughs for the conductors 42 and 44. Suitable dielectric coolant liquids include polyalphaolefin, (Gulf Synfluid 2CST), silicate ester (Monsanto Coolanol 25R), (Silicone (GE SF96)), or any of the other widely available dielectric coolant liquids, many of which are hydrocarbon oils. Both the power and control of the electronics are exposed to the dielectric liquid coolant.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A cooling system for an electronic semiconductor power module (10) comprising:
   a housing (12) with a bottom formed by plenum (14) and with a back wall (26), wherein said bottom of said housing (12) contains a first group (18) of nozzle holes, a second group (20) of nozzle holes and a third group (23) of nozzle holes;
   a base plate (24) mounted on standoffs (23, 25) in said housing (12) to position said base plate (24) away from said back wall (26) of said housing (12);
   a printed wiring board (28) carrying printed wiring, wherein said printed wiring board (28) is supported by said base plate (24) in said housing (12);
   a first plurality of semiconductor dies (30, 32, 34) mounted on a side of said printed wiring board (28) in a first upright row above said first group (18) of nozzle holes;
   a second plurality of semiconductor dies (36, 38, 40) mounted on said side of said printed wiring board (28) in a second upright row above said second group (20) of nozzle holes;
   input connection (16) mounted in said plenum (14) for providing liquid dielectric cooling liquid through which dielectric liquid is flowed into said plenum (14);
   output connection (22) mounted in said plenum (14) for dispelling liquid dielectric cooling liquid through which dielectric liquid is flowed out of said plenum (14);
   electrical conductors (42, 44) mounted on said printed wiring board (28) to which the first plurality (30, 32, 34) and the second plurality (36, 38, 40) are connected by wires for electrical connection;
   wherein dielectric fluid is directed from said first group (18) of nozzle holes directly across the first plurality of semiconductor dies (30, 32, 34), dielectric fluid is directed from the second group (20) of nozzle holes directly across the second plurality of semiconductor dies (36, 38, 40), and dielectric fluid is directed behind said base plate (24) from the third group (27) of nozzle holes.

* * * * *